United States Patent
Yu et al.

(10) Patent No.: US 9,992,880 B2
(45) Date of Patent: Jun. 5, 2018

(54) RIGID-BEND PRINTED CIRCUIT BOARD FABRICATION

(71) Applicant: Multek Technologies Limited, San Jose, CA (US)

(72) Inventors: Pui Yin Yu, Tsuen Wan (HK); Mark Zhang, Guangdong (CN); Jiawen Chen, Guangdong (CN)

(73) Assignee: Multek Technologies Limited, San Jose, CA (US)

( * ) Notice: Subject to any disclaimer, the term of this patent is extended or adjusted under 35 U.S.C. 154(b) by 0 days. days.

(21) Appl. No.: 14/995,139

(22) Filed: Jan. 13, 2016

(65) Prior Publication Data
US 2017/0142829 A1    May 18, 2017

(30) Foreign Application Priority Data
Nov. 12, 2015   (CN) .......................... 2015 1 0772318

(51) Int. Cl.
*H05K 3/36*   (2006.01)
*H05K 3/46*   (2006.01)

(52) U.S. Cl.
CPC . *H05K 3/4691* (2013.01); *H05K 2201/09127* (2013.01); *H05K 2201/09781* (2013.01); *H05K 2203/0228* (2013.01); *Y10T 29/49126* (2015.01)

(58) Field of Classification Search
CPC .... H05K 1/0278; H05K 1/0298; H05K 1/115; H05K 1/144; H05K 3/067; H05K 3/181; H05K 3/4611; H05K 2203/061; Y10T 29/49126; Y10T 29/49124; Y10T 29/49117; Y10T 29/49002

USPC ............... 29/830, 829, 825, 592.1, 832, 846
See application file for complete search history.

(56) References Cited

U.S. PATENT DOCUMENTS

| | | |
|---|---|---|
| 5,651,176 A | 7/1997 | Ma |
| 6,743,982 B2 | 6/2004 | Biegelsen |
| 7,167,373 B1 | 1/2007 | Hoang |
| 7,786,389 B2 | 8/2010 | Tsukada |
| 8,269,112 B2 | 9/2012 | Lee |
| 9,018,532 B2 | 4/2015 | Wesselmann |
| 9,340,003 B2 * | 5/2016 | Chang .................. H05K 3/4697 |
| 2004/0113250 A1 | 6/2004 | Khandros |
| 2004/0192082 A1 | 9/2004 | Wagner |
| 2009/0173529 A1 | 7/2009 | Lee |
| 2009/0317639 A1 | 12/2009 | Axisa |
| 2010/0116526 A1 | 5/2010 | Arora |
| 2011/0119812 A1 | 5/2011 | Genz |
| 2011/0163569 A1 | 7/2011 | Yoneyama |
| 2012/0051005 A1 | 3/2012 | Vanfleteren |

(Continued)

*Primary Examiner* — Peter DungBa Vo
*Assistant Examiner* — Azm Parvez
(74) *Attorney, Agent, or Firm* — Haverstock & Owens LLP

(57) ABSTRACT

A printed circuit board (PCB) has multiple layers, where select portions of one or more conductive layers, referred to as core circuitry, form a semi-flexible PCB portion that is protected by an exposed prepreg layer. The semi-flexible PCB portion having an exposed prepreg layer is formed using a dummy core process that leaves the exposed prepreg layer smooth and undamaged. The core circuitry is part of a core structure. The semi-flexible PCB portion is an extension of the remaining adjacent multiple layer PCB. The remaining portion of the multiple layer PCB is rigid. The core structure is common to both the semi-flexible PCB portion and the remaining rigid PCB portion.

14 Claims, 15 Drawing Sheets

(56) References Cited

U.S. PATENT DOCUMENTS

2012/0279762 A1    11/2012  Hur
2013/0220535 A1*   8/2013   Lee ..................... H05K 3/4644
                                                        156/268
2015/0065840 A1    3/2015   Bailey
2016/0007468 A1*   1/2016   Tomikawa ........... H05K 1/0204
                                                        174/260

* cited by examiner

RIGID-BEND PRINTED CIRCUIT BOARD FABRICATION

CROSS-REFERENCE TO RELATED APPLICATION(S)

This application claims priority under 35 U.S.C. § 119(a)-(d) of the Chinese Patent Application No: 201510772318.6, filed Nov. 12, 2015 and titled, "RIGID-BEND PRINTED CIRCUIT BOARD FABRICATION," which is hereby incorporated by reference in its entirety for all purposes.

FIELD OF THE INVENTION

The present invention is generally directed to printed circuit boards. More specifically, the present invention is directed to printed circuit boards having select semi-flexible circuitry layers.

BACKGROUND OF THE INVENTION

A printed circuit board (PCB) mechanically supports and electrically connects electronic components using conductive traces, pads and other features etched from electrically conductive sheets, such as copper sheets, laminated onto a non-conductive substrate. Multi-layered printed circuit boards are formed by stacking and laminating multiple such etched conductive sheet/non-conductive substrate. Conductors on different layers are interconnected with plated-through holes called vias.

A printed circuit board includes a plurality of stacked layers, the layers made of alternating non-conductive layers and conductive layers. The non-conductive layers can be made of prepreg or base material that is part of a core structure, or simply core. Prepreg is a fibrous reinforcement material impregnated or coated with a thermosetting resin binder, and consolidated and cured to an intermediate stage semi-solid product. Prepreg is used as an adhesive layer to bond discrete layers of multilayer PCB construction, where a multilayer PCB consists of alternative layers of conductors and base materials bonded together, including at least one internal conductive layer. A base material is an organic or inorganic material used to support a pattern of conductor material. A core is a metal clad base material where the base material has integral metal conductor material on one or both sides. A laminated stack is formed by stacking multiple core structures with intervening prepreg and then laminating the stack. A via is then formed by drilling a hole through the laminated stack and plating the wall of the hole with electrically conductive material, such as copper. The resulting plating interconnects the conductive layers. In some applications, the plating extends uninterrupted through the entire thickness of the via and each conductive layer is connected to the plating, thereby providing a common interconnection with each and every conductive layer. In other applications, it may be desired that only certain conductive layers be commonly interconnected by the plating within the via.

SUMMARY OF THE INVENTION

Embodiments are directed to a printed circuit board having multiple layers, where select sections, referred to as plugs, are removed to form thin semi-flexible PCB portions that include inner layer circuitry, referred to as inner core circuitry. The semi-flexible PCB portions are bendable along with the corresponding inner core circuitry. The printed circuit board having a bendable inner core circuitry is formed using a dummy core. The select inner core circuitry is part of an inner core. During manufacturing of the printed circuit board, a prepreg layer is applied over the select inner core circuitry and a dummy core is applied over the prepreg. The prepreg and the dummy core protect the select inner core circuitry during subsequent process steps and also enable removal of the plug aligned with the inner core circuitry as described in detail below. Removing the plug also removes the dummy core, but leaves the prepreg layer intact so that the inner core circuitry is protected. In some embodiments, the inner core corresponding to the bendable inner core circuitry forms the semi-flexible, or semi-flex, PCB portion. The semi-flex PCB portion is an extension of the remaining adjacent multiple layer PCB. The remaining portion of the multiple layer PCB is rigid, referred to as the rigid PCB portion. The inner core is a layer(s) of the printed circuit board and is therefore common to both the semi-flex PCB portion and the remaining rigid PCB portion. In some embodiments, the semi-flex PCB portion is formed from interior layers within the printed circuit board. In other embodiments, the semi-flex PCB portion is formed from exterior layers of the printed circuit board.

In an aspect, a printed circuit board is disclosed. The printed circuit board includes a rigid printed circuit board portion and a semi-flexible printed circuit board portion. The rigid printed circuit board portion comprises a laminated stack of a plurality of non-conducting layers and a plurality of conductive layers. The laminated stack further comprises a first portion of a core structure. The semi-flexible printed circuit board portion comprises a second portion of the core structure. The core structure is a continuous structure that extends through both the rigid printed circuit board portion and the semi-flexible printed circuit board portion. The second portion of the core structure comprises core circuitry and the semi-flexible printed circuit board portion further comprises an exposed non-conductive layer covering the core circuitry. The exposed non-conductive layer has an exposed surface that is smooth. In some embodiments, each of the conductive layers is pattern etched. In some embodiments, the printed circuit board also includes one or more plated through hole vias in the rigid printed circuit board portion. In some embodiments, the rigid printed circuit board portion comprises a first rigid printed circuit board portion, further wherein the printed circuit board further comprises a second rigid printed circuit board portion comprising a second laminated stack of a plurality of non-conducting layers and a plurality of conductive layers, wherein the second laminated stack further comprises a third portion of the core structure. In some embodiments, the core structure comprises a core non-conductive layer having a first surface and a first conductive layer positioned on the first surface of the inner core non-conductive layer. In some embodiments, the first conductive layer of the core structure comprises the core circuitry in the second portion of the inner core structure. In some embodiments, wherein the core non-conductive layer has a second surface opposing the first surface, further wherein the core structure further comprises a second conductive layer positioned on the second surface of the core non-conductive layer. In some embodiments, the second conductive layer of the core structure comprises the core circuitry in the second portion of the inner core structure. In some embodiments, wherein the semi-flexible printed circuit board portion is coupled to one or more most exterior layers of the laminated stack of the rigid circuit board portion thereby forming an outer bend configuration.

In some embodiments, the semi-flexible printed circuit board portion is coupled to one or more interior layers of the laminated stack of the rigid circuit board portion thereby forming an inner bend configuration.

In another aspect, a printed circuit board set form is disclosed. The printed circuit board set form comprises a plurality of printed circuit boards and a breakaway substrate. The plurality of printed circuit boards are aligned within a common plane, wherein each printed circuit board is mechanically connected by a common substrate. Each printed circuit board comprises a rigid printed circuit board portion and a semi-flexible printed circuit board portion. The rigid printed circuit board portion comprises a laminated stack of a plurality of non-conducting layers and a plurality of conductive layers. The laminated stack further comprises a first portion of a core structure. The semi-flexible printed circuit board portion comprises a second portion of the core structure. The core structure is a continuous structure that extends through both the rigid printed circuit board portion and the semi-flexible printed circuit board portion. The second portion of the core structure comprises core circuitry and the semi-flexible printed circuit board portion further comprises an exposed non-conductive layer covering the core circuitry. The exposed non-conductive layer has an exposed surface that is smooth. The breakaway substrate is aligned within the common plane and mechanically connected around a perimeter of the connected plurality of printed circuit boards. The breakaway substrate includes a dummy core portion. In some embodiments, the breakaway substrate provides lateral structural stability to the connected plurality of printed circuit boards. In some embodiments, the plurality of printed circuit boards are electrically isolated from each other.

In yet another aspect, a method of manufacturing a printed circuit board is disclosed. The method includes forming core structure having core circuitry on at least one surface of the core structure, and forming a printed circuit board stack up. The printed circuit board stack up comprises the core structure, a dummy core, one or more non-conductive layers and one or more conductive layers. One of the non-conductive layers is positioned between the dummy core and the core circuitry. The method also includes laminating the printed circuit board stack up, thereby forming a laminated stack. The method also includes forming a depth controlled rout from a surface of the laminated stack to the dummy core and around a perimeter of the dummy core, wherein a portion of the laminated stack within the perimeter of the rout and to a depth including the dummy core forms a laminated stack plug. The method also includes removing the laminated stack plug, thereby exposing the one non-conductive layer positioned between the dummy core and the core circuitry. The exposed non-conductive layer has an exposed surface that is smooth. In some embodiments, the perimeter of the dummy core corresponds to a perimeter of the core circuitry. In some embodiments, the method also includes forming the dummy core, wherein the dummy core comprises a non-conductive layer and a conductive layer. In some embodiments, the dummy core is stacked on the one non-conductive layer such that the conductive layer of the dummy core contacts the one non-conductive layer. In some embodiments, the method also includes forming at least one plated through hole via in the laminated stack prior to forming the depth controlled rout, wherein the at least one plated through hole via is not aligned within the core circuitry. In some embodiments, the method also includes pattern etching the conductive layers in the laminated stack prior to forming the printed circuit board stack up. In some embodiments, forming the core structure comprises applying a first conductive layer on a first surface of a non-conductive layer and applying a second conductive layer on a second surface of the non-conductive layer. In some embodiments, the first conductive layer is pattern etched and the second conductive layer is pattern etched.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a printed circuit board. Those of ordinary skill in the art will realize that the following detailed description of the printed circuit board is illustrative only and is not intended to be in any way limiting. Other embodiments of the printed circuit board will readily suggest themselves to such skilled persons having the benefit of this disclosure.

Reference will now be made in detail to implementations of the printed circuit board as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
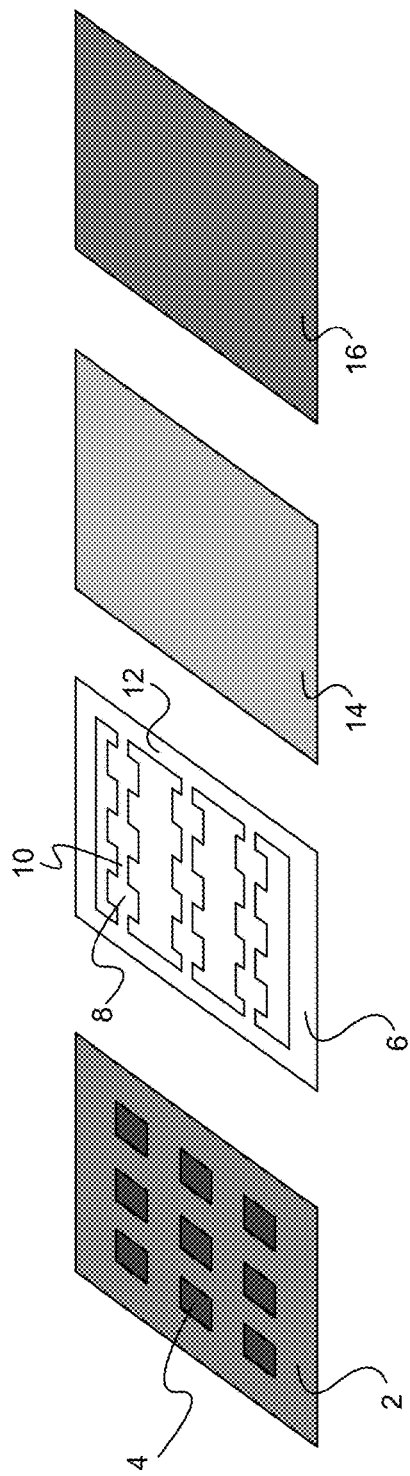
FIG. 1 illustrates a perspective top view of various layers included in a printed circuit board prior to stacking and lamination according to some embodiments.

FIG. 1 illustrates a perspective top view of various layers included in a printed circuit board prior to stacking and lamination according to some embodiments. The various layers include an inner core structure 2, a dummy core 6, a layer 14 and a layer 16. The layer 14 is a non-conductive, insulating layer, such as prepreg. The layer 16 is a conductive layer, such as copper foil or laminate, where a laminate includes a non-conductive layer such as base material and a conductive layer on one or both sides of non-conductive layer. In some embodiments, the layer 16 is representative of a multilayer buildup that can include many interspersed conductive and non-conductive layers. Each conductive layer in the layer 16 is selectively patterned and etched to form conductive circuitry. Select portions of the conductive circuitry in the conductive layer 16 is part of a subsequent semi-flex PCB portion of the printed circuit board, as described in greater detail below.

The inner core structure 2 includes multiple layers (not shown). In some embodiments, the inner core structure 2 includes a non-conductive layer, such as prepreg or a base material, and a conductive layer on each surface of the non-conductive layer. It is understood that alternative core structures can be use which include a conductive layer on only one surface of the non-conductive layer. The conductive layers are patterned and etched to form conductive interconnects. Select portions of the inner core structure 2 coincide with locations that are to be made into semi-flex PCB portions, these locations are referred to as bend locations 4. The bend locations 4 are coincident with plugs that are to be subsequently removed during a decap process, as described in detail below. As such, the bend locations 4 do not include circuitry that is to be used in the completed printed circuit board. However, the bend locations 4 may include conductive material which functions as a support during a subsequent lamination process.

In some embodiments, the dummy core 6 is a two-layer structure. A first layer is a non-conductive layer, such as a base material. The second layer is a conductive layer, such as a copper foil. The dummy core 6 is shaped similar to an inverted stencil where the stencil pattern is formed of the dummy core material and the area surrounding the pattern is free of material. The pattern of the dummy core 6 includes overlay portions 8 that have substantially the same shape and size as the areas of bend locations 4. The pattern of the dummy core 6 also includes interconnect portions 10 that connect the overlay portions 8 and an outer perimeter portion 12. The interconnect portions 10 and the outer perimeter portion 12 of the dummy core pattern provide a stable framework for accurately placing the overlay portions 8 relative to the bend locations 4.

Figure 2:
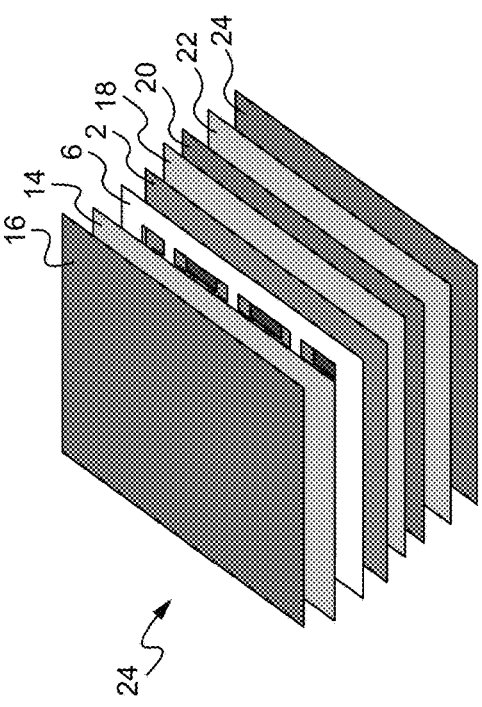
FIG. 2 illustrates an exemplary PCB stack-up according to some embodiments.

A PCB stack-up is formed by stacking various combinations of the layers, or similar to the layers, shown in FIG. 1. FIG. 2 illustrates an exemplary PCB stack-up 26 according to some embodiments. The stack-up 26 includes the layer 16, the non-conductive layer 14, the dummy core pattern 6, the inner core structure 2, a layer 18, an inner core structure 20, a layer 22 and a layer 24. The inner core structure 20 is similar to the inner core structure 2 in that it has similarly located bend locations, however, the conductive interconnects of the inner core structure 20 and the conductive interconnects of the inner core structure are separately configured according to the specifications of the overall printed circuit board. The layer 22 is a non-conductive, insulating layer, such as prepreg. The layer 24 can represent a single layer, a laminate or a multilayer buildup with each conductive layer in the layer 24 selectively patterned and etched to form conductive interconnects.

Figure 3:
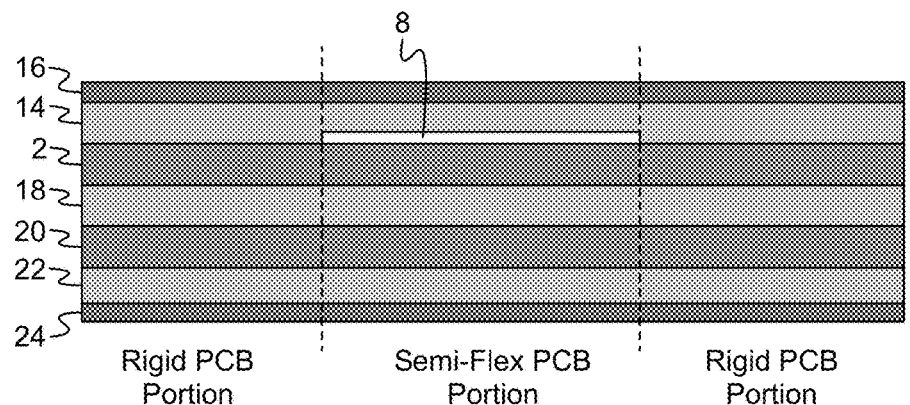
FIG. 3 illustrates a cut out side view of a portion of the PCB-stack-up shown in FIG. 2 after lamination.
Figure 4:
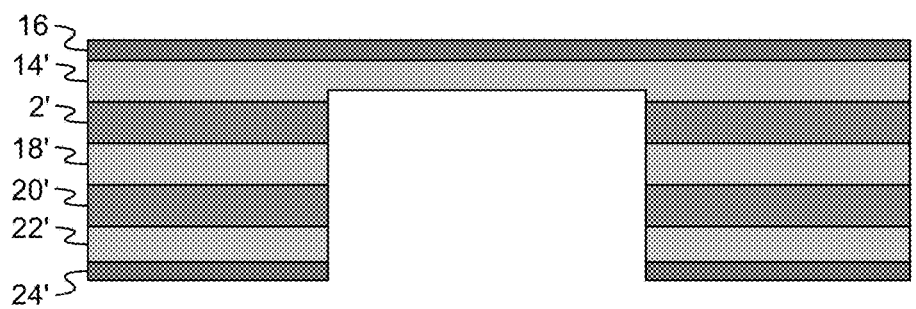
FIG. 4 illustrates a cut out side view of the PCB stack-up of FIG. 3 after a decap process.

A laminated stack is formed by laminating the PCB stack-up 26 shown in FIG. 2. Any conventional lamination technique can be used. FIG. 3 illustrates a cut out side view of a portion of the PCB-stack-up shown in FIG. 2 after a lamination step is performed. The portion of the PCB stack-up shown in FIG. 3 coincides with an overly portion 8 of the dummy core pattern 6 aligned with core circuitry of the layer 16. With the dummy core positioned on the prepreg layer 14, the dummy core touches firmly with the prepreg under lamination pressure. A total thickness of the dummy core is thicker than an adjacent area such that prepreg resin flows into the adjacent area under lower pressure. Subsequent routing and decap steps are performed to remove the overlay portion 8, and corresponding sections of layers 2, 18, 20, 22 and 24 aligned with overlay portion 8 such that the remaining exterior layers 14', 16 form a semi-flex PCB portion, as shown in FIG. 4.

Figure 5:
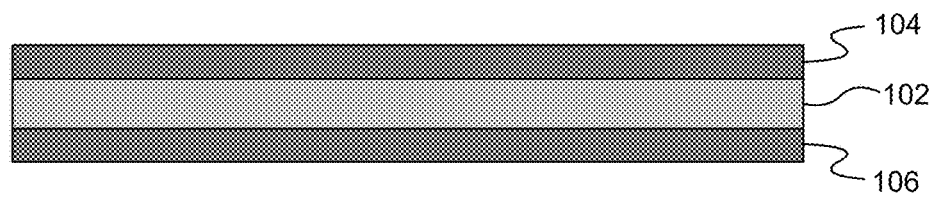
FIGS. 5-13 illustrate various steps in the process used to manufacture a printed circuit board according to some embodiments.

Similar processes and techniques can be used to form semi-flex PCB portions from interior layers of the laminated stack. FIGS. 5-13 illustrate various steps in the process used to manufacture a printed circuit board according to some embodiments. The printed circuit board manufactured using the various steps shown in FIGS. 5-13 is similar to and shares features of the printed circuit boards and constituent layers shown in FIGS. 1-4. Each of the FIGS. 5-13 illustrate a cut out side view of the printed circuit board according to the various process steps. In FIG. 5, an exemplary core structure is shown. The core structure is a metal clad base material including a non-conductive base material layer 102 and conductive layers 104, 106 formed on both opposing surfaces. It is understood that an alternative core structure can be used which includes a conductive layer on only one surface of the non-conductive layer.

Figure 6:
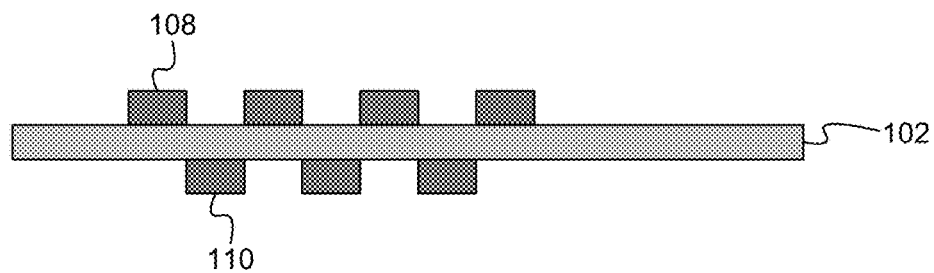

In FIG. 6, the conductive layers 104 and 106 are selectively pattern etched to form core circuitry 108 and 110, respectively. Alternatively, the conductive layers 104, 106 are already pattern etched during fabrication of the core structure in FIG. 5. It is understood that FIG. 5-13 only show a portion of the printed circuit board and in particular only show a portion of the core structure. Additional interconnects and circuitry may be formed on portions of the core structure not shown in FIGS. 5-13, those portions to be included as part of a rigid PCB portion of the printed circuit board.

Figure 7:
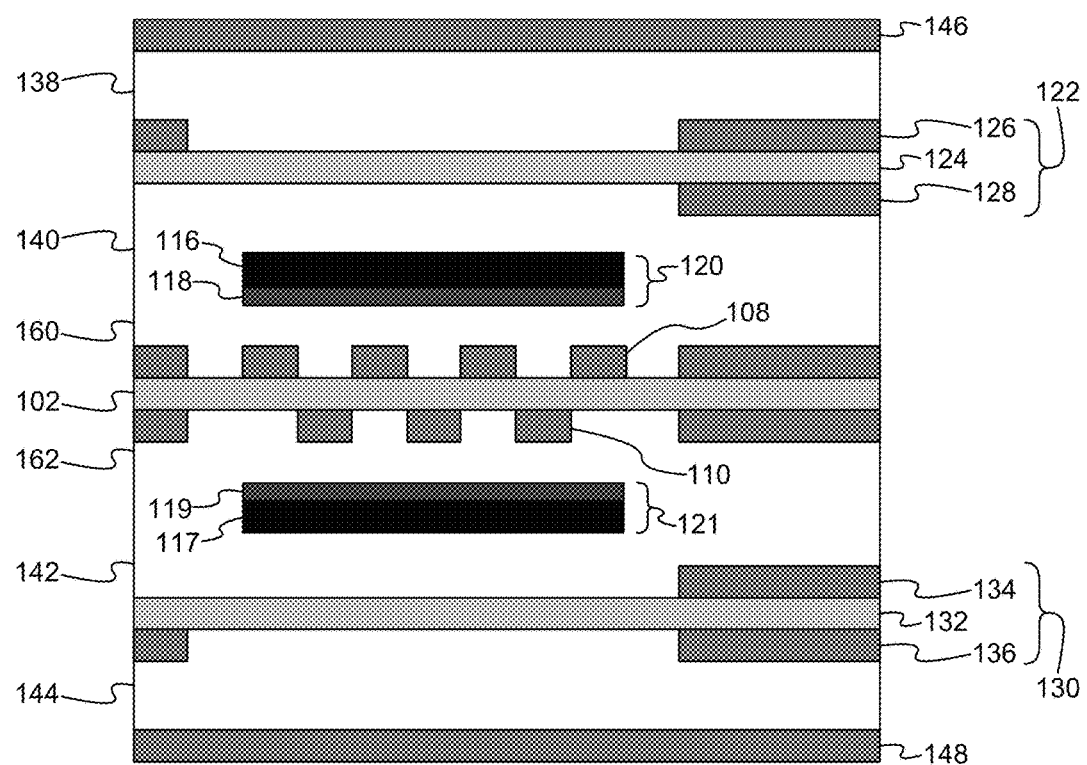

In FIG. 7, additional core structures and dummy core structures are fabricated, and the core structures, the inner core assembly and the dummy core structures are stacked with intervening non-conductive layers. The additional core structures are similar to the core structure of FIG. 5 with the conductive layers pattern etched accordingly. However, the conductive layers of the additional core structures are formed such that the resulting interconnects will be positioned in a rigid PCB portion of the resulting printed circuit board. In the exemplary configuration shown in FIG. 7, two additional core structures are included. A first core structure 122 includes a non-conductive layer 124 and conductive layers 126 and 128. The conductive layers 126 and 128 are selectively pattern etched. As shown in FIG. 7, the portions of the conductive layers 126 and 128 aligned with the core circuitry 108 are removed. However, removal of the conductive layers 126 and 128 is optional and in other embodiments these portions of the conductive layers 126 and 128 may remain. A second core structure 130 includes a non-conductive layer 132 and conductive layers 134 and 136. The conductive layers 134 and 136 are selectively pattern etched. As shown in FIG. 7, the portions of the conductive layers 134 and 136 aligned with the core circuitry 110 are removed. However, removal of the conductive layers 134 and 136 is optional and in other embodiments these portions of the conductive layers 134 and 136 may remain.

A dummy core 120 is aligned with the core circuitry 108 and a dummy core 121 is aligned with the core circuitry 110.

The dummy core 120 and the dummy core 121 can each be representative of an overlay portion of a larger dummy core pattern, such as the overlay portion 8 in FIG. 1. The dummy core 120 includes a conductive layer 118 and a non-conductive layer 116, the dummy core 120 is oriented such that the conductive layer 118 is positioned against a non-conductive layer 160, such as prepreg. The type of conductive material of the conductive layer 118 has a low adhesion to the material type of the non-conductive layer 160. This low adhesion enables removal of the dummy core 120 from non-conductive layer 160 during a subsequent decap step shown and described in relation to FIG. 12. The dummy core 121 includes a conductive layer 119 and a non-conductive layer 117, the dummy core 121 is oriented such that the conductive layer 119 is positioned against a non-conductive layer 162, such as prepreg. The type of conductive material of the conductive layer 119 has a low adhesion to the material type of the non-conductive layer 162. This low adhesion enables removal of the dummy core 121 from non-conductive layer 162 during a subsequent decap step.

The intervening non-conductive layer 160 is positioned between the conductive layer 118 of the dummy core 120 and the core circuitry 108, and the intervening non-conductive layer 162 is positioned between the conductive layer 119 of the dummy core 121 and the core circuitry 110.

An intervening non-conductive layer 140 is positioned between the dummy core 120 and the core structure 122, and an intervening non-conductive layer 142 is positioned between the dummy core 121 and the core structure 130. In the exemplary configuration shown in FIG. 7, additional conductive layer 146 and intervening non-conductive layer 138 are added to the top of the stack and additional conductive layer 148 and intervening non-conductive layer 144 are added to the bottom of the stack, where the terms top and bottom are used only in relation to the orientation shown in FIG. 7. A single lamination step results in the laminated stack shown in FIG. 7.

Figure 8:
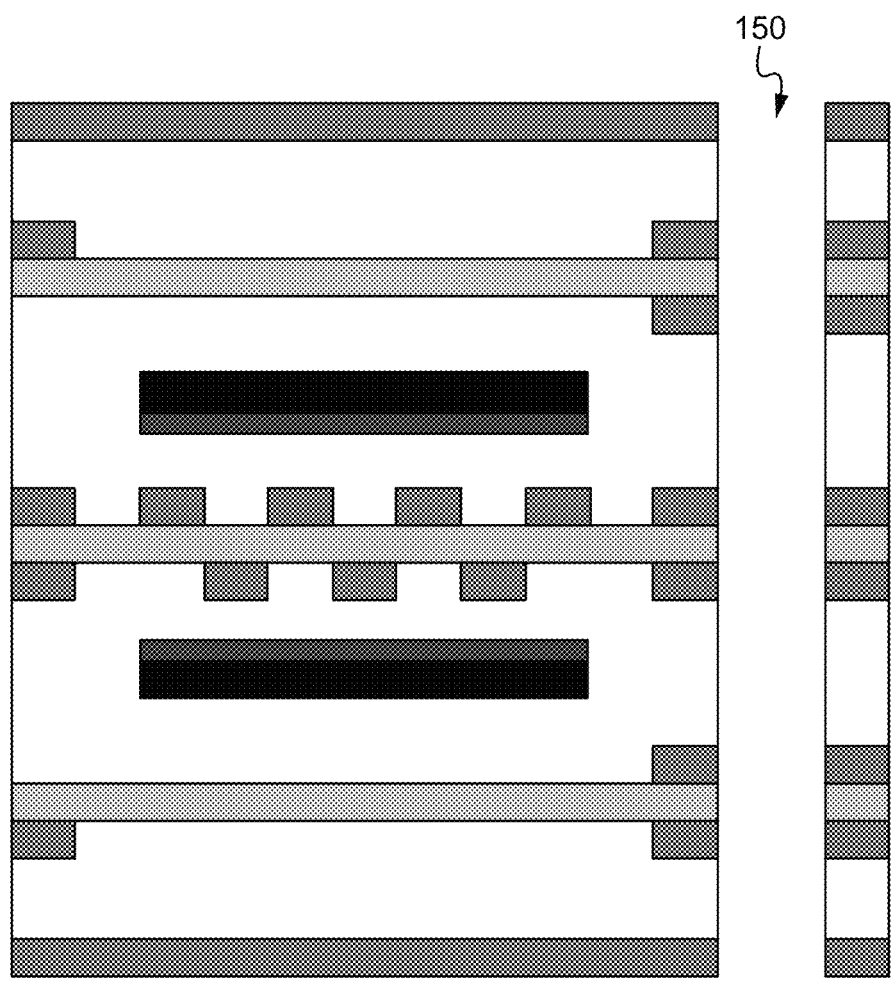

In FIG. 8, selective holes are drilled through the laminated stack of FIG. 7 to form vias, such as via 150. Vias are formed in those portions of the printed circuit board that will be rigid PCB portions.

Figure 9:
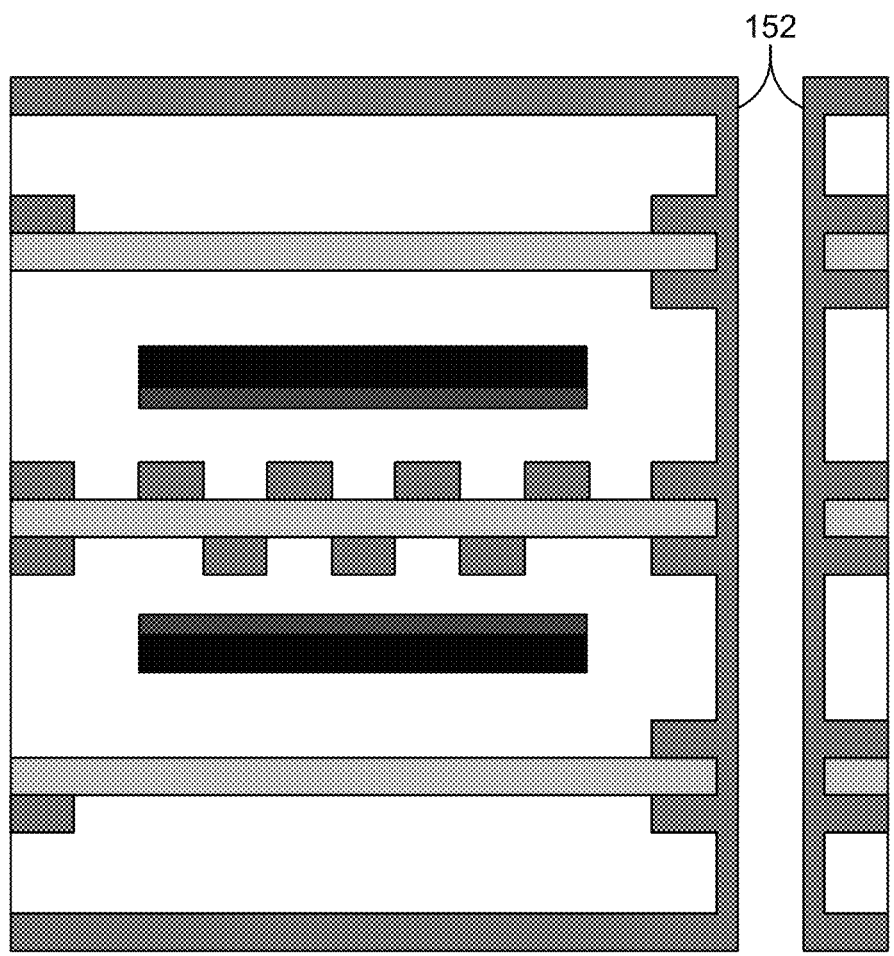

In FIG. 9, a desmear process is performed to remove residue, such as residual particles from the drilling of via 150. Next, an electroless plating process is performed to form plating 152 on the side walls of the via 150. In some embodiments, copper is used as the plating material. It is understood that other plating materials can be used. The plating 152 forms an interconnect with various conductive layers in the stack.

Figure 10:
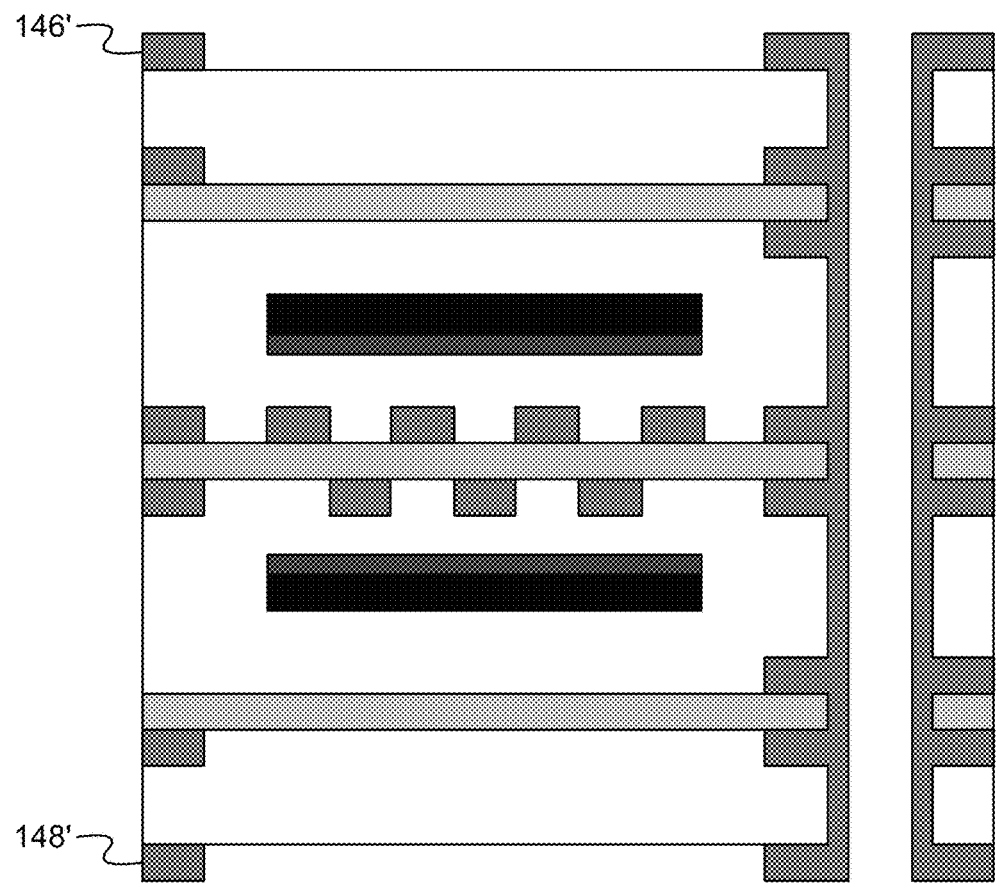

In FIG. 10, an outer conducting layer etching process is performed. The additional conductive layers 146 and 148 on the top and bottom, respectively, of the laminated stack are pattern etched to form patterned conductive layers 146' and 148'. Optionally, the portions of the conductive layers 146 and 148 aligned with the dummy cores 120 and 121, respectively, are removed.

Figure 11:
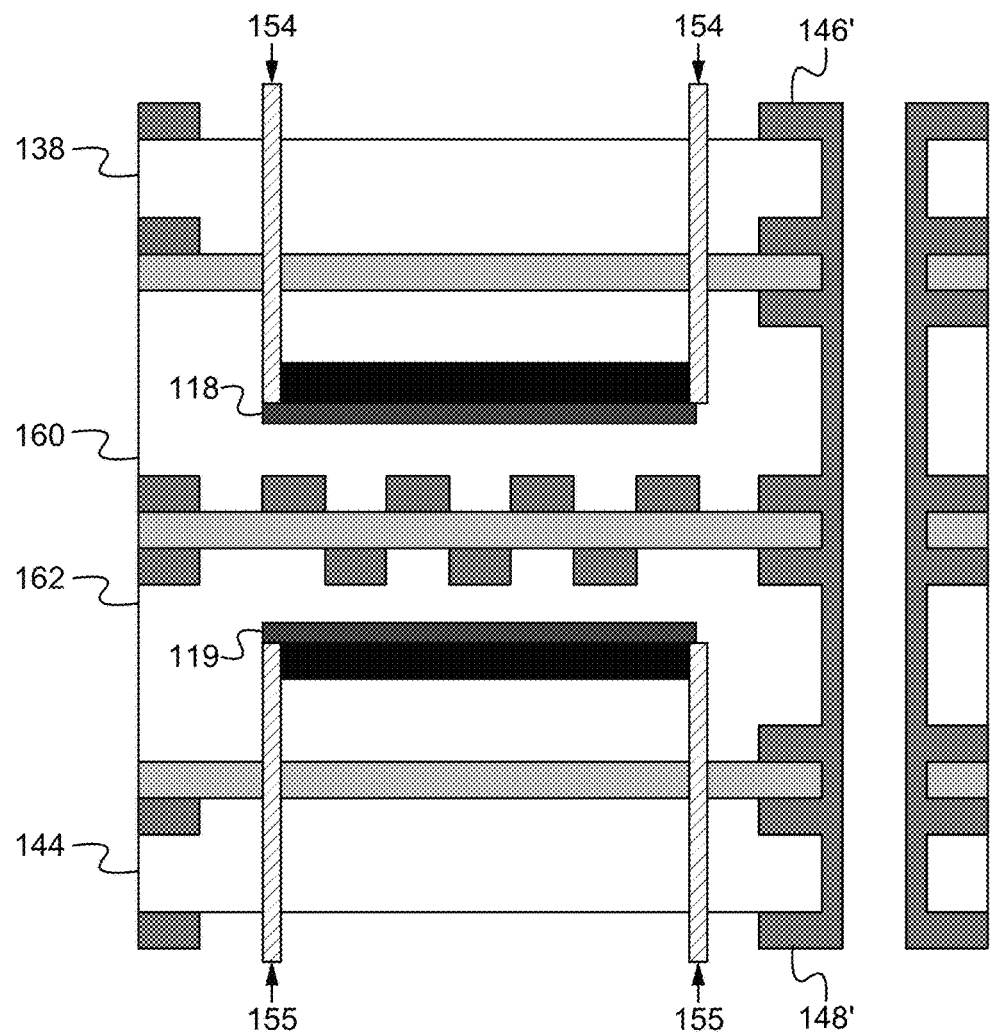
Figure 12:
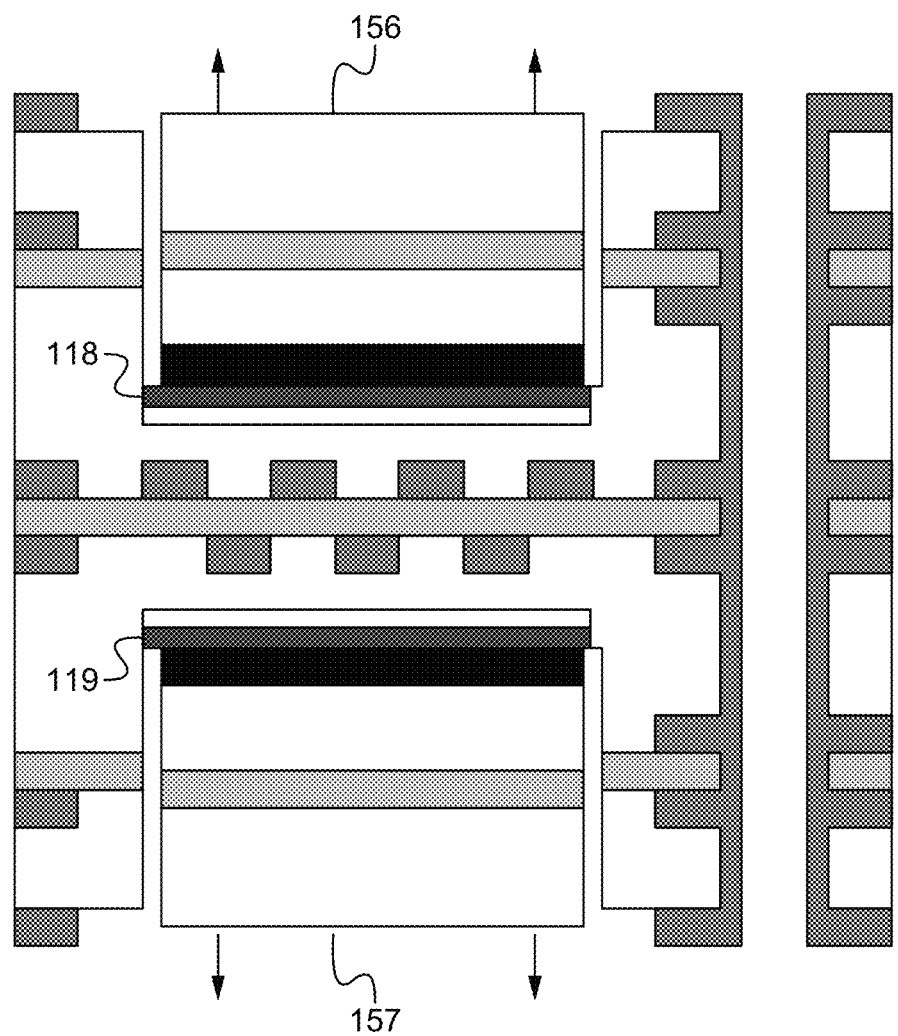
Figure 13:
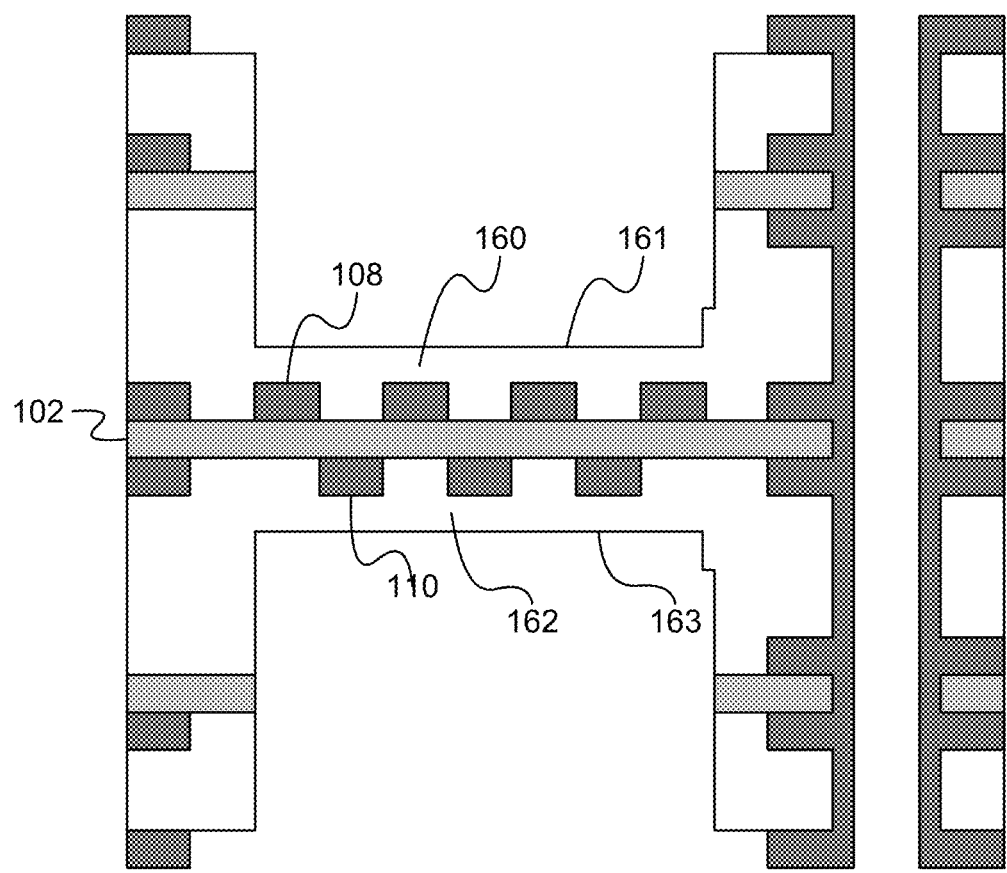

In FIG. 11, a depth controlled rout step is performed. In some embodiments, a routing tool having a rout bit is used to form a rout into the laminated stack to a depth of the conductive layer on the respective dummy core. As shown in FIG. 11, a rout 154 is made from the non-conductive layer 138 to the conductive layer 118 of the dummy core 120, and a rout 155 is made from the non-conductive layer 144 to the conductive layer 119 of the dummy core 121. FIG. 11 shows a two dimensional view of the rout 154 and 155. In three-dimensions, the routs 154 and 155 are formed at an outer perimeter of the dummy cores 120 and 121, respectively. A lateral rout is also performed such that the conductive layers 118 and 119 are free from lateral prepreg material In FIG. 12, a plug 156 is removed and a plug 157 is removed, thereby exposing the non-conductive layers 160 and 162, respectively, as shown in FIG. 13. The exposed non-conductive layers 160 and 162, the inner core circuitry 108 and 110, and the non-conductive base material layer 102 form a semi-flex PCB portion. The plug 156 is the area within the rout 154 perimeter and between the non-conducive layer 138 and the conductive layer 118 of the dummy core 120. The plug 157 is the area within the rout 155 perimeter and between the non-conductive layer 144 and the conductive layer 119 of the dummy core 121. Removal of the plugs 156 and 157 is referred to as a decap process. The low adhesion between the conductive layer 118 and the non-conductive layer 160, and between the conductive layer 119 and the non-conductive layer 162 enables the plugs to simply be pulled apart from the non-conductive material. Removal of the plug 156 leaves a surface 161 of the exposed non-conductive layer 160 undamaged and smooth. In some embodiments, a "smooth" surface has roughness that is less than 5 um. In some embodiments, such as those configurations where the non-conductive layer 160 is prepreg, if there is damage to the non-conductive layer 160 then glass weave is found. The non-conductive layer 160 provides protection for the underlying core circuitry 108. Using the dummy core 122 as a means for forming the undamaged smooth surface 161 also provides a semi-flex PCB portion that is much less likely to break than one having a protective layer with a damaged, roughened surface. Such a damaged, roughened surface may be formed by not using a dummy core and instead routing out the entire area corresponding to the plug 156. Such a routing process would also result in a less exact thickness of the layer 160 due to the tolerance of the routing machine. In contrast, the process using the dummy core enables finer control of the layer 160 thickness. Similarly, removal of the plug 157 leaves a surface 163 of the exposed non-conductive layer 162 undamaged and smooth.

It is understood that the various structural configurations and the position of the semi-flex PCB portion shown in the embodiments of FIGS. 5-13 can be interchanged according to a specific application and application requirement.

FIGS. 5-13 show an exemplary configuration where the semi-flex PCB portion is formed from interior layers within the printed circuit board stack up. This is referred to as an inner bend configuration. In other embodiments, the semi-flex PCB portion is formed from exterior layers within the printed circuit board stack up. This is referred to as an outer bend configuration. FIGS. 14-22 illustrate various steps in the process used to manufacture a printed circuit board according to other embodiments. The printed circuit board manufactured using the various steps shown in FIGS. 14-22 is similar to and shares features of the printed circuit board and constituent layers shown in FIGS. 5-13 except that the FIGS. 14-22 are directed to an outer bend configuration. Each of the FIGS. 14-22 illustrate a cut out side view of the printed circuit board according to the various process steps.

Figure 14:
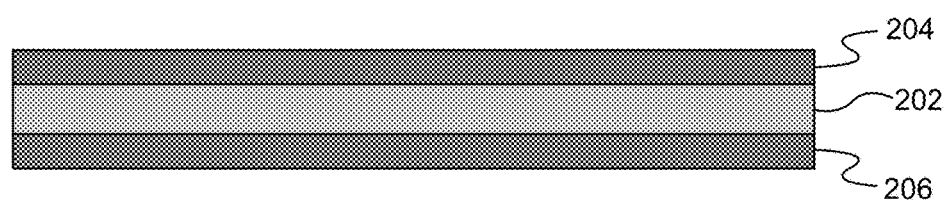
FIGS. 14-22 illustrate various steps in the process used to manufacture a printed circuit board according to other embodiments.

In FIG. 14, an exemplary core structure is shown. The core structure is a metal clad base material including a non-conductive base material layer 202 and conductive layers 204 and 206 formed on both opposing surfaces. It is understood that an alternative core structure can be used which includes a conductive layer on only one surface of the non-conductive layer.

Figure 15:
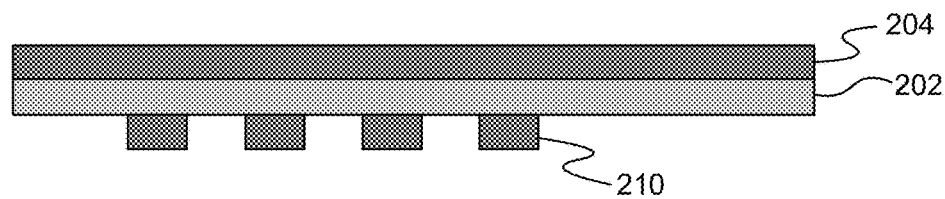

In FIG. 15, the conductive layer 206 is selectively pattern etched to form core circuitry 210. Alternatively, the conductive layer 206 is already pattern etched during fabrication of the core structure in FIG. 15. It is understood that FIGS. 14-22 only show a portion of the printed circuit board and in particular only show a portion of the core structure. Additional interconnects and circuitry may be formed on portions of the core structure not shown in FIGS. 14-22, those portions to be included as part of a rigid PCB portion of the printed circuit board.

Figure 16:
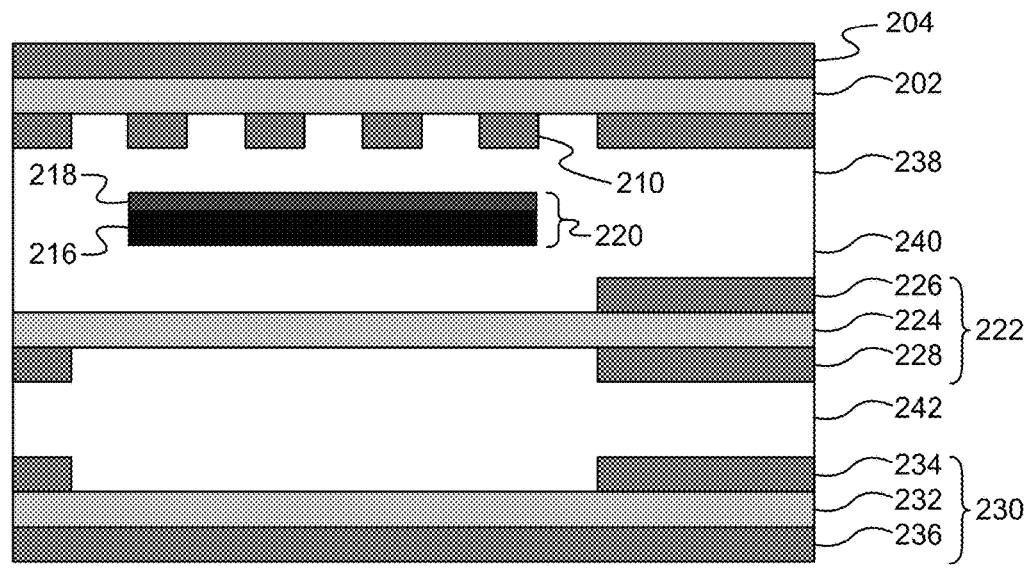

In FIG. 16, additional core structures and a dummy core structure are fabricated, and the additional core structures, the dummy core structure and the core structure from FIG. 15 are stacked with intervening non-conductive layers. The additional core structures are similar to the core structure of FIG. 15 with one or both conductive layers pattern etched accordingly. However, the conductive layers of the additional core structures are formed such that the resulting interconnects will be positioned in a rigid PCB portion of the resulting printed circuit board. In those portions of the additional core structures that are part of a subsequent plug to be removed during a decap process, the corresponding conductive layer portions can be etched away or left intact. In the exemplary configuration shown in FIG. 16, two additional core structures are included. A first core structure 222 includes a non-conductive layer 224 and conductive layers 226 and 228. The conductive layers 226 and 228 are selectively pattern etched. As shown in FIG. 16, the portions of the conductive layers 226 and 228 aligned with the core circuitry 210 are removed. Alternatively, the portions of the conductive layers 226 and 228 aligned with the core circuitry 210 can be left intact. A second core structure 230 includes a non-conductive layer 232 and conductive layers 234 and 236. The conductive layer 234 is selectively pattern etched.

A dummy core 220 is aligned with the core circuitry 210. The dummy core 220 can be representative of an overlay portion of a larger dummy core pattern, such as the overlay portion 8 in FIG. 1. The dummy core 220 includes a conductive layer 218 and a non-conductive layer 216. The dummy core 220 is oriented such that the conductive layer 218 is positioned against a non-conductive layer 238, such as prepreg. The type of conductive material of the conductive layer 218 has a low adhesion to the material type of the non-conductive layer 238. This low adhesion enables removal of the dummy core 220 from the non-conductive layer 238 during a subsequent decap step shown and described in relation to FIG. 21. The non-conductive layer 238 is positioned between the conductive layer 218 of the dummy core 220 and the core circuitry 210. An intervening non-conductive layer 240 is positioned between the dummy core 220 and the core structure 222, and an intervening non-conductive layer 242 is positioned between the core structure 222 and the core structure 230. A single lamination step results in the laminated stack shown in FIG. 16.

Figure 17:
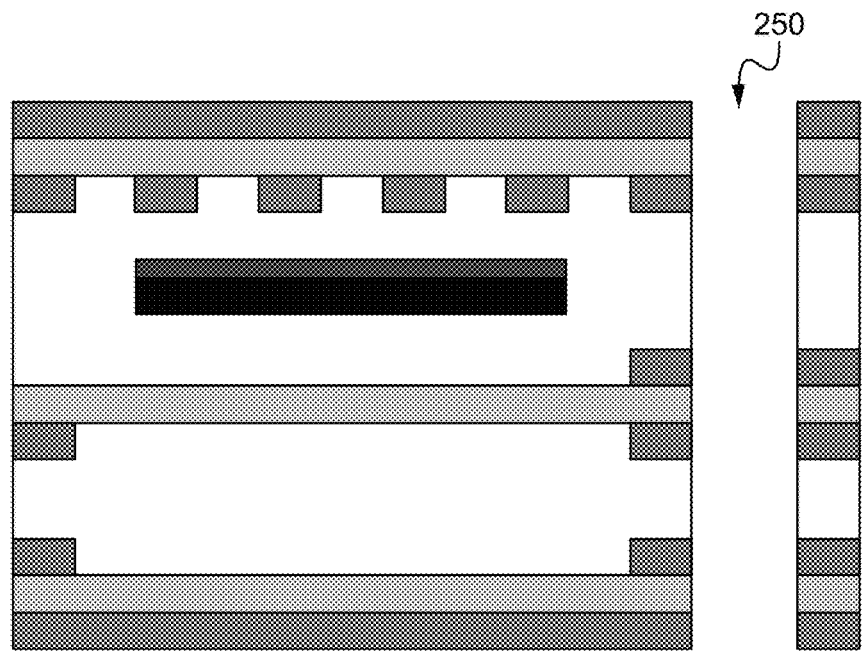

In FIG. 17, selective holes are drilled through the laminated stack of FIG. 16 to form vias, such as via 250. Vias are formed in those portions of the printed circuit board that will be rigid PCB portions.

Figure 18:
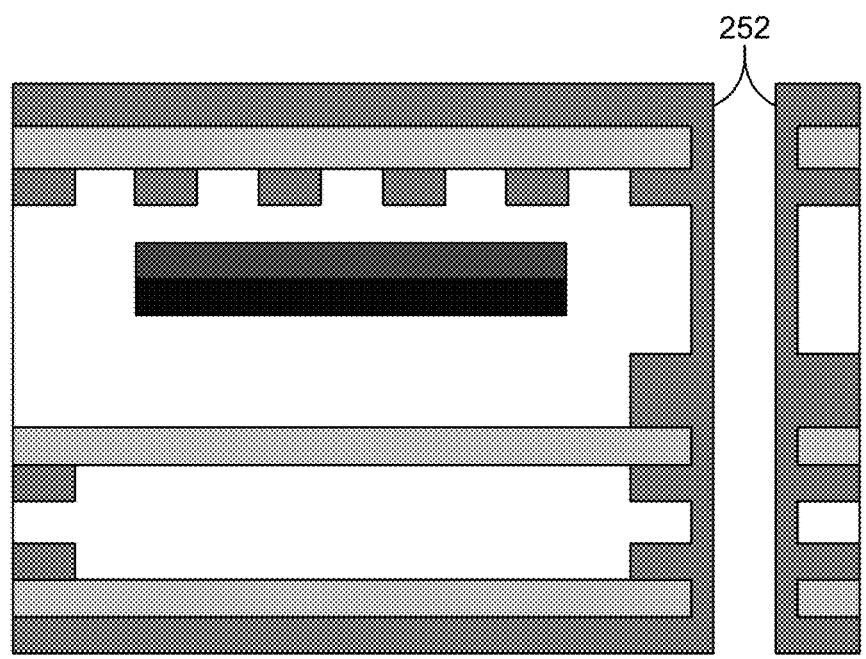

In FIG. 18, a desmear process is performed to remove residue, such as residual particles from the drilling of via 250. Next, an electroless plating process is performed to form plating 252 on the side walls of the via 250. In some embodiments, copper is used as the plating material. It is understood that other plating materials can be used. The plating 252 forms an interconnect with various conductive layers in the stack.

Figure 19:
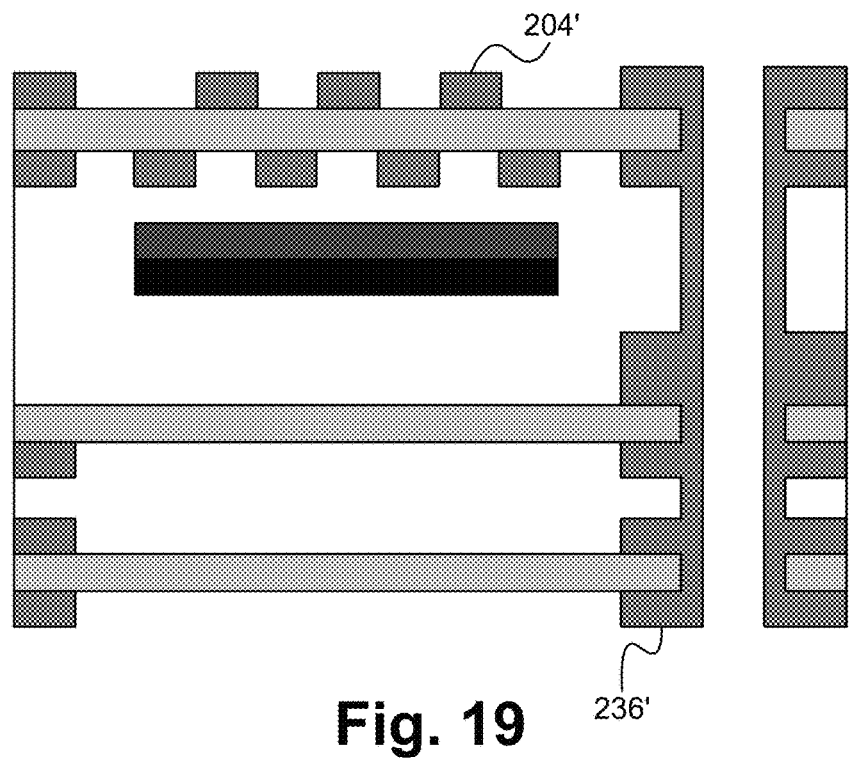

In FIG. 19, an outer conducting layer etching process is performed. The conductive layers 204 and 236 on the top and bottom, respectively, of the laminated stack are pattern etched to form patterned conductive layers 204' and 236'. The terms top and bottom are used only in relation to the orientation shown in FIG. 19. Optionally, the portion of the conductive layer 236' aligned with the dummy core 220 is removed.

Figure 20:
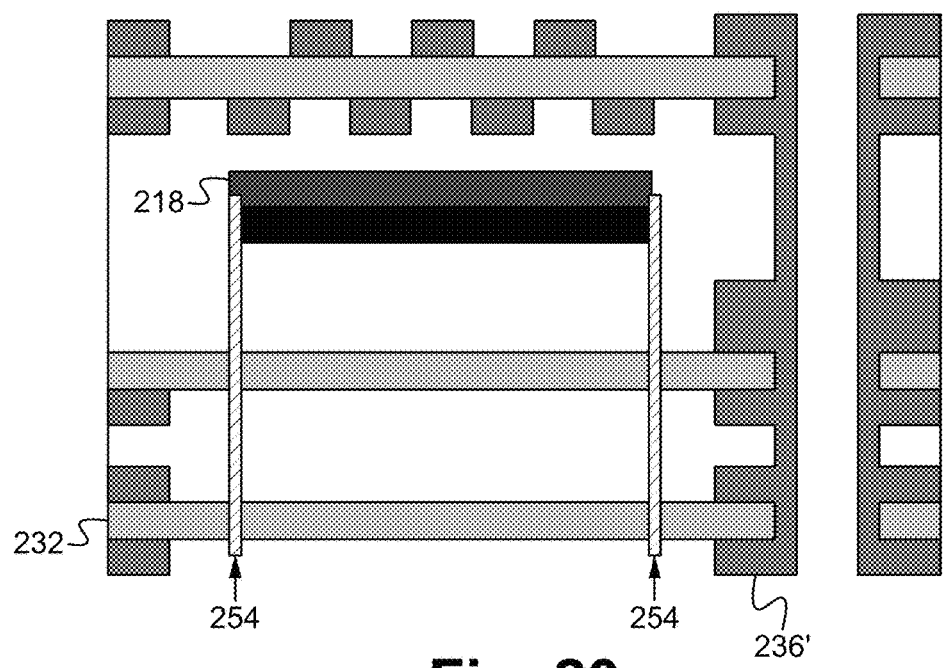

In FIG. 20, a depth controlled rout step is performed. As shown in FIG. 20, a rout 254 is made from the non-conductive layer 232 to the conductive layer 218 of the dummy core 220. FIG. 20 shows a two dimensional view of the rout 254. In three-dimensions, the rout 254 is formed at an outer perimeter of the dummy core 220. A lateral rout can also be performed such that the conductive layer 218 is free from lateral prepreg material.

Figure 21:
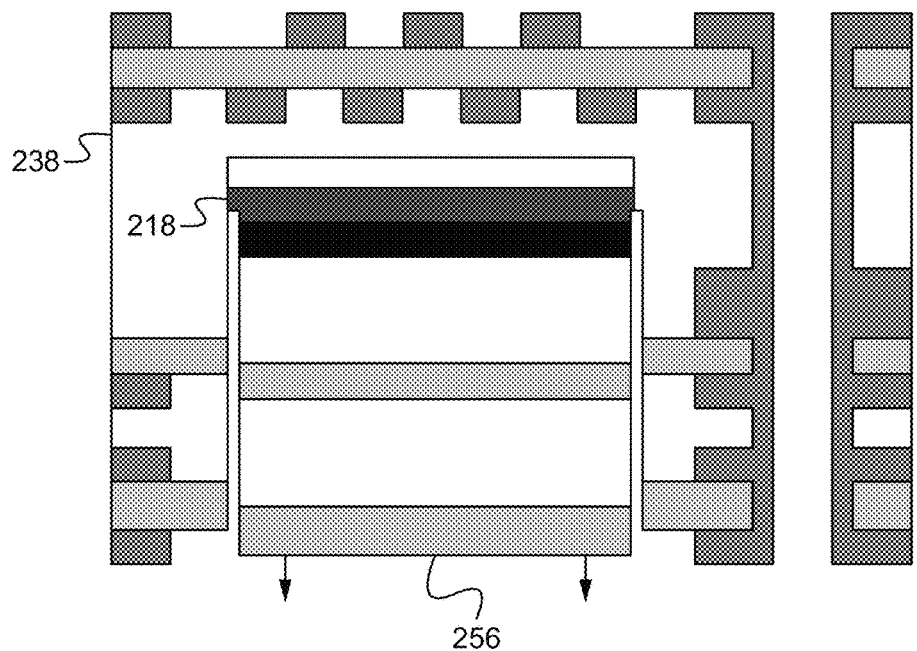
Figure 22:
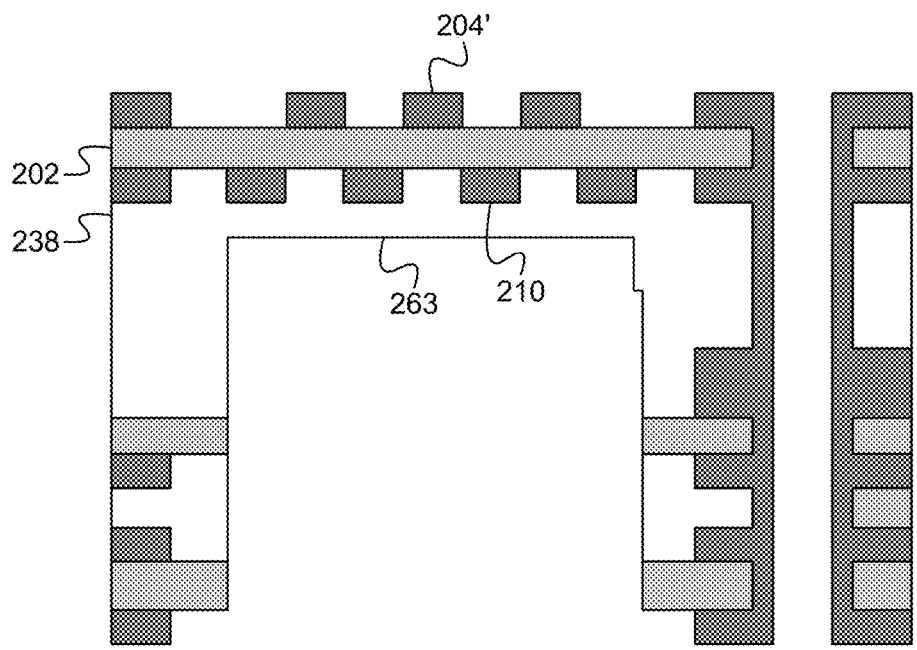

In FIG. 21, a plug 256 is removed, thereby exposing the non-conductive layer 238, as shown in FIG. 22. The exposed non-conductive layers 238, the inner core circuitry 210, the non-conductive base material layer 202 and the conductive layer 204' form a semi-flex PCB portion. The plug 256 is the area within the rout 254 perimeter and between the non-conducive layer 232 and the conductive layer 218 of the dummy core 220. The low adhesion between the conductive layer 218 and the non-conductive layer 238 enables the plug to simply be pulled apart from the non-conductive material. Removal of the plug 256 leaves a surface 263 of the exposed non-conductive layer 238 undamaged and smooth. The non-conductive layer 238 provides protection for the underlying core circuitry 210.

It is understood that the various structural configurations and the position of the semi-flex PCB portion shown in the embodiments of FIGS. 14-22 can be interchanged according to a specific application and application requirement.

Figure 23:
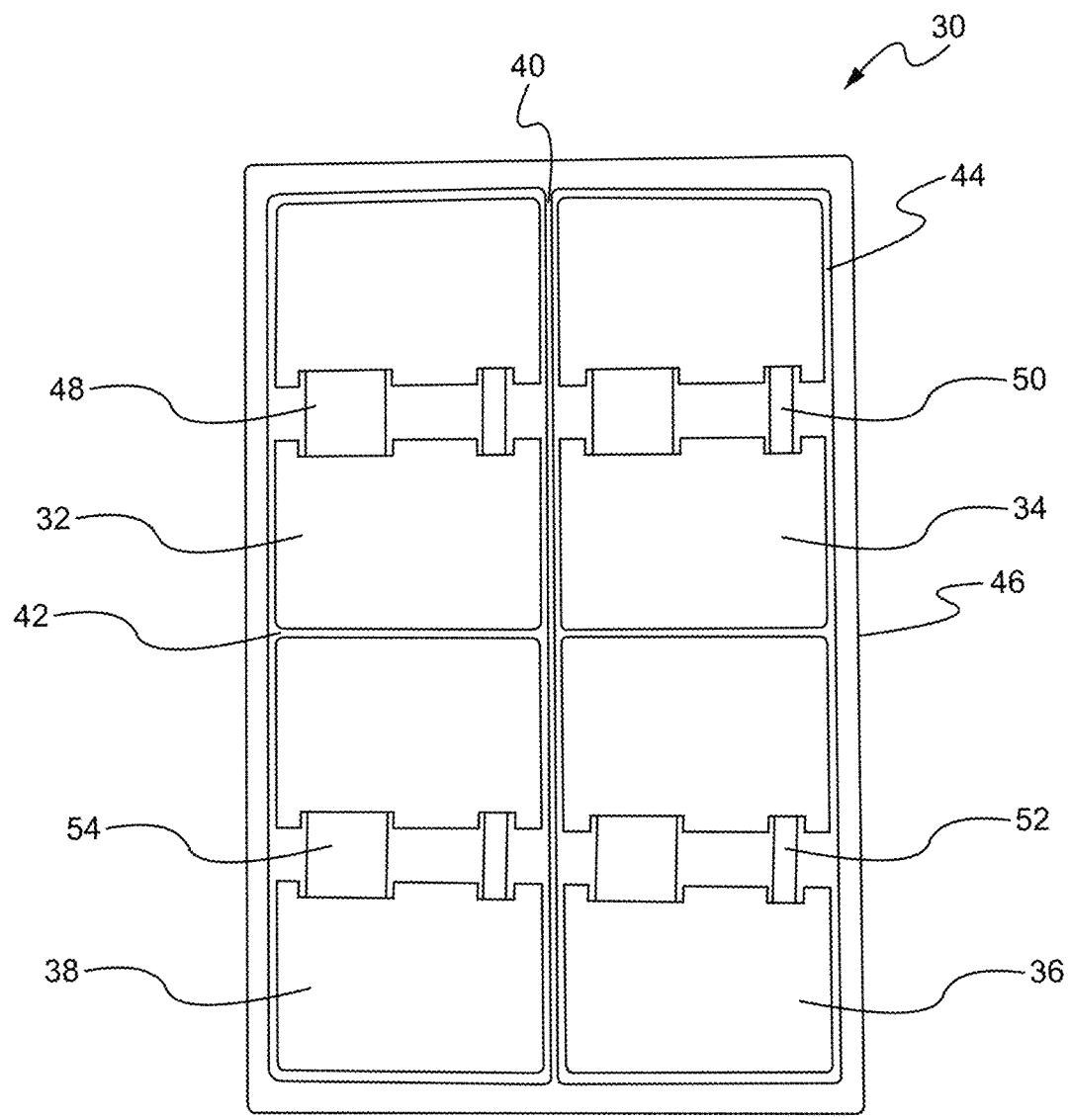
FIG. 23 illustrates an exemplary PCB set form according to an embodiment.

In some manufacturing processes, multiple PCBs are manufactured as discrete portions of a single substrate, which are separated into individual PCBs at the end of the manufacturing process. Such a single substrate configuration is referred to as a PCB set form. FIG. 23 illustrates an exemplary PCB set form according to an embodiment. The exemplary PCB set form 30 includes four PCBs 32, 34, 36, 38. It is understood that PCB set forms can include more or less than the exemplary four PCBs shown in FIG. 23. The PCBs 32, 34, 36, 38 are connected physically but not electrically. Each PCB 32, 34, 36, 38 includes semi-flex PCB portions 48, 50, 52, 54, respectively. In some embodiments, an additional routing step is applied to an outer perimeter portion of a PCB set form. The additional routing step can be performed at any point in the printed circuit board manufacturing process after the lamination step is performed. For example, in the printed circuit board manufacturing process shown in FIGS. 5-13, the additional routing step can be performed at any point after the lamination step shown in FIG. 7. The additional routing step removes a perimeter portion of the laminated PCB stack up including the outer perimeter portion of the dummy core pattern, such as the outer perimeter portion 12 of FIG. 1. A resulting perimeter area surrounding the PCBs 32, 34, 36, 38 in the PCB set form 30 is shown in FIG. 23 as breakaway area 46.

The PCBs 32, 34, 36, 38 are ready for surface components to be mounted on select areas, such as through a surface mount technology (SMT) process. After the components are mounted, the PCBs are separated for subsequent installation into other devices. Separating the PCBs can be performed using any conventional process including, but not limited to, cutting the PCB set form 30 along etched lines 40, 42, 44. Cutting along the perimeter etch lines 44 separates the breakaway area 46 from the PCBs 32, 34, 36, 38, and cutting along the etch lines 40, 42 separates the PCBs 32, 34, 36, 38 from each other.

Figure 24:
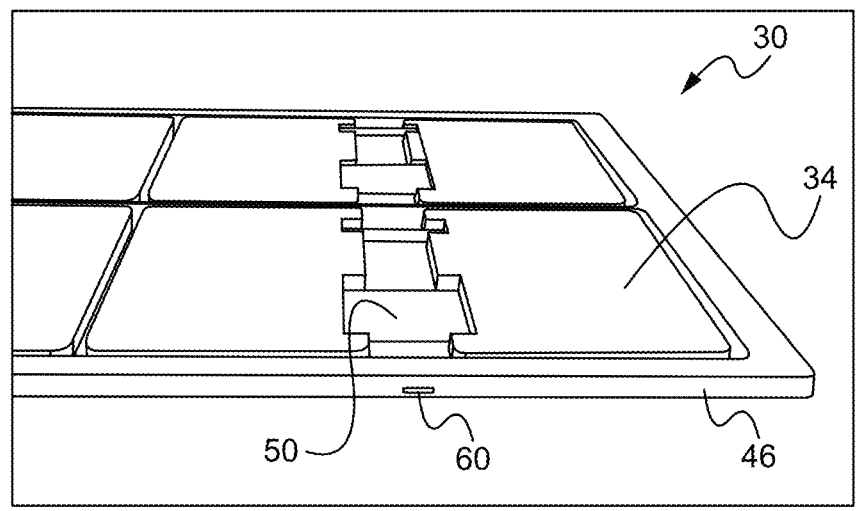
FIG. 24 illustrates a perspective side view of the PCB set form of FIG. 23.

FIG. 24 illustrates a perspective side view of the PCB set form 30 of FIG. 23. The breakaway area 46 includes a dummy core portion 60, which is a remnant of a dummy core pattern used to form the semi-flex PCB portion 50 in the PCB 34. As exemplified in FIG. 1, a dummy core pattern can include an interconnect portion, such as the interconnect portion 10 of the dummy core pattern 6 in FIG. 1, a portion of which coincides with the breakaway area of a PCB set form, such as the breakaway area 46 in FIG. 24. As such, although the outer perimeter portion of the dummy core pattern, such as the outer perimeter portion 12 in FIG. 1, as well as the overlay portions of the dummy core pattern that are applied over the core circuitry of the semi-flex PCB portion, such as the overlay portions 8 in FIG. 1, are removed during the PCB manufacturing process, the interconnect portions that connect to the outer perimeter portion of the dummy core pattern remain.

In some embodiments, the semi-flex PCB portions can be formed as connector sections between rigid PCB portions, such as the configuration shown in FIG. 23. The semi-flex PCB portion is flexible thereby enabling two adjoining rigid PCB portions to rotate, or pivot, relative to each other The present application has been described in terms of specific embodiments incorporating details to facilitate the understanding of the principles of construction and operation of the printed circuit board. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A method of manufacturing a printed circuit board comprising:
    a. forming core structure having core circuitry on at least one surface of the core structure;
    b. forming a printed circuit board stack up, wherein the printed circuit board stack up comprises the core structure, a dummy core, one or more non-conductive layers and one or more conductive layers, wherein one of the non-conductive layers is positioned between the dummy core and the core circuitry, further wherein the dummy core comprises a non-conductive layer and a conductive layer, and forming the printed circuit board stack up further comprises positioning the conductive layer of the dummy core in contact with the one non-conductive layer stacked in contact with the core circuitry;
    c. laminating the printed circuit board stack up, thereby forming a laminated stack;
    d. forming a depth controlled rout from a surface of the laminated stack to the dummy core and around a perimeter of the dummy core, wherein a portion of the laminated stack within the perimeter of the rout and to a depth including the dummy core forms a laminated stack plug; and
    e. removing the laminated stack plug, thereby exposing the one non-conductive layer positioned between the dummy core and the core circuitry, wherein the exposed non-conductive layer has an exposed surface that is smooth.

2. The method of claim 1 wherein the perimeter of the dummy core corresponds to a perimeter of the core circuitry.

3. The method of claim 2 further comprising forming the dummy core, wherein the dummy core comprises a non-conductive layer and a conductive layer.

4. The method of claim 3 wherein the dummy core is stacked on the one non-conductive layer such that the conductive layer of the dummy core contacts the one non-conductive layer.

5. The method of claim 1 further comprising forming at least one plated through hole via in the laminated stack prior to forming the depth controlled rout, wherein the at least one plated through hole via is not aligned within the core circuitry.

6. The method of claim 1 further comprising pattern etching the conductive layers in the laminated stack prior to forming the printed circuit board stack up.

7. The method of claim 1 wherein forming the core structure comprises applying a first conductive layer on a first surface of a non-conductive layer and applying a second conductive layer on a second surface of the non-conductive layer.

8. The method of claim 7 wherein the first conductive layer is pattern etched and the second conductive layer is pattern etched.

9. The method of claim 1 wherein forming the depth controlled rout from the surface of the laminated stack to the dummy core and around the perimeter of the dummy core comprises leaving intact a volume of the laminated stack within the perimeter, wherein the portion of the laminated stack within the perimeter of the rout and to the depth including the dummy core forms the laminated stack plug which remains intact within the laminated stack, and removing the laminated stack plug comprises pulling the laminated stack plug out of the laminated stack.

10. The method of claim 9 wherein while the laminated stack plug remains intact with the laminated stack, the dummy core contacts the one non-conductive layer and the contact forms a sufficiently weak adhesion to enable the laminated stack plug to be pulled apart from the remaining laminated stack.

11. The method of claim 1 wherein a footprint of the dummy core matches a surface area of the exposed surface of the exposed non-conductive layer.

12. The method of claim 1 wherein the smooth exposed surface has a roughness that is less than 5 um.

13. The method of claim 1 wherein a footprint of the dummy core defines an outer perimeter of a semi-flexible printed circuit board portion of the printed circuit board, a remaining portion of the printed circuit board is rigid printed circuit board portion of the printed circuit board.

14. The method of claim 13 wherein forming the printed circuit board stack up comprises stacking the one non-conductive layer in contact with the core circuitry of the core structure and stacking the dummy core in contact with the one non-conductive layer such that the dummy core is vertically aligned with the core circuitry.

* * * * *